(12) United States Patent
Arlid et al.

(10) Patent No.: US 7,180,943 B1
(45) Date of Patent: Feb. 20, 2007

(54) COMPRESSION OF A DATA STREAM BY SELECTION AMONG A SET OF COMPRESSION TOOLS

(75) Inventors: Bertelrud Arlid, Hampton, VA (US); Franz Russell, Lancaster, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 691 days.

(21) Appl. No.: 10/113,637

(22) Filed: Mar. 26, 2002

(51) Int. Cl.
H04B 1/66 (2006.01)
(52) U.S. Cl. .............................. 375/240.06
(58) Field of Classification Search .......... 375/240.26; 725/95; H04B 1/66
See application file for complete search history.

(56) References Cited

U.S. PATENT DOCUMENTS

| | | | |
|---|---|---|---|
| 4,823,342 A | 4/1989 | Morita et al. ............... 370/109 |
| 4,831,636 A | 5/1989 | Taniguchi et al. ............ 375/27 |
| 4,882,754 A * | 11/1989 | Weaver et al. .............. 704/201 |
| 5,432,555 A | 7/1995 | Park .......................... 348/404 |
| 5,513,181 A | 4/1996 | Bresalier et al. ............. 370/79 |
| 5,568,199 A | 10/1996 | Kajimoto et al. ........... 348/390 |
| 5,576,766 A | 11/1996 | Matsumoto et al. ........ 348/407 |
| 5,719,961 A * | 2/1998 | Normile et al. ............. 382/239 |
| 5,767,908 A | 6/1998 | Choi .......................... 348/403 |
| 5,802,361 A * | 9/1998 | Wang et al. ................ 382/217 |
| 5,883,672 A | 3/1999 | Suzuki et al. ............... 348/405 |
| 5,892,847 A * | 4/1999 | Johnson ..................... 382/232 |
| 5,909,250 A | 6/1999 | Hardiman ................... 348/405 |
| 6,011,868 A * | 1/2000 | van den Branden et al. ..... 382/233 |
| 6,072,836 A | 6/2000 | Hardiman ................... 375/240 |
| 6,084,636 A | 7/2000 | Sugahara et al. ........... 348/405 |
| 6,084,910 A | 7/2000 | Stanger et al. .............. 315/240 |
| 6,122,338 A | 9/2000 | Yamauchi ................... 375/377 |
| 6,167,060 A | 12/2000 | Vargo et al. ................ 370/468 |
| 6,233,278 B1 * | 5/2001 | Dieterich ................ 375/240.03 |
| 6,256,064 B1 * | 7/2001 | Chujoh et al. ......... 375/240.23 |
| 6,272,175 B1 | 8/2001 | Sriram et al. ............... 375/240 |
| 6,414,992 B1 * | 7/2002 | Sriram et al. .......... 375/240.13 |
| 6,542,549 B1 * | 4/2003 | Tan et al. .............. 375/240.26 |
| 6,545,727 B1 * | 4/2003 | Pau et al. ................... 348/700 |
| 6,611,624 B1 * | 8/2003 | Zhang et al. ............... 382/232 |
| 6,633,674 B1 * | 10/2003 | Barnes et al. .............. 382/232 |
| 6,665,872 B1 * | 12/2003 | Krishnamurthy et al. ..... 725/95 |
| 6,792,151 B1 * | 9/2004 | Barnes et al. .............. 382/239 |
| 6,795,583 B1 * | 9/2004 | Barnes et al. .............. 382/239 |
| 6,909,745 B1 * | 6/2005 | Puri et al. .............. 375/240.01 |
| 6,912,317 B1 * | 6/2005 | Barnes et al. .............. 382/239 |

* cited by examiner

Primary Examiner—Tung Vo
(74) Attorney, Agent, or Firm—Mark Homer

(57) ABSTRACT

A stream of raw data is compressed prior to transmission in a communication channel by a system which includes modules for choosing a current segment of the raw data stream for processing and defining a set of operators for representing data segments by a mathematical operation and parameters thereof. The system performs a competitive evaluation of different tools comprising different combinations of one or more of the operators and the parameters thereof with respect to the current data segment in order to determine relative abilities among the different tools to reduce the number of bits required to represent the current data segment. The system then selects a tool and a set of parameters thereof found in the competitive evaluation to have a superior ability relative to others of the different tools to reduce a number of bits required to represent the current data segment.

20 Claims, 5 Drawing Sheets

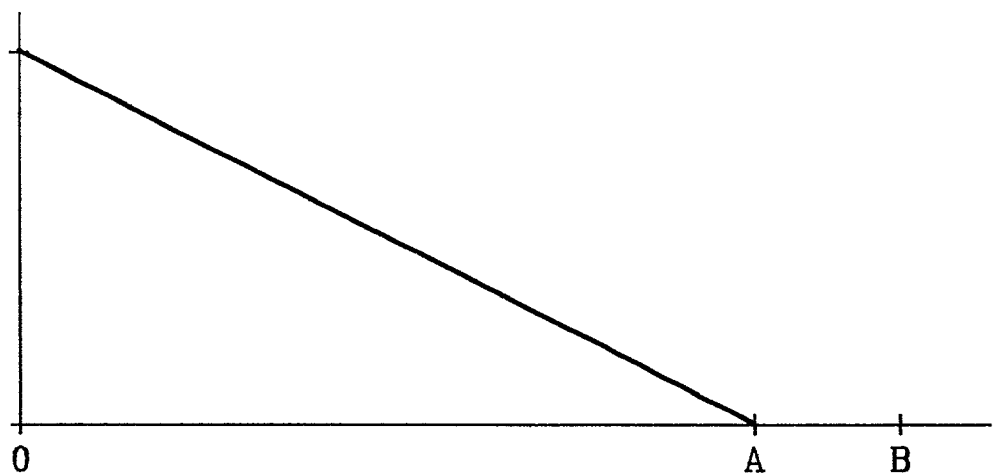
FIG. 3
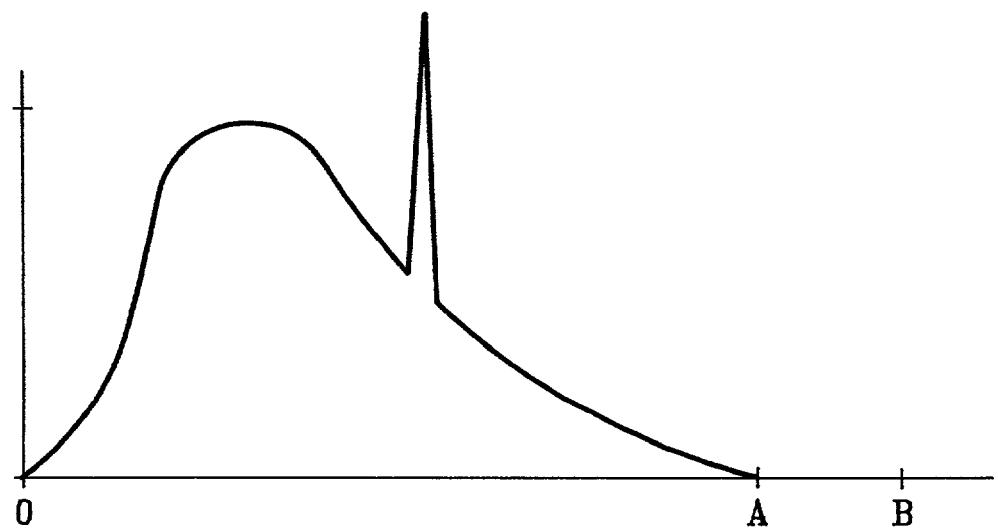
FIG. 4
 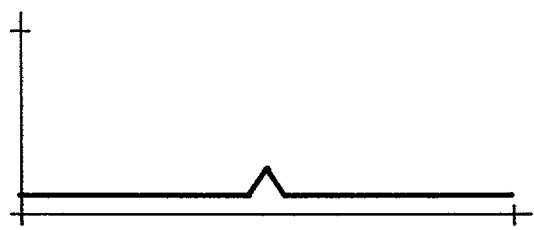
FIG. 5A            FIG. 5B

COMPRESSION OF A DATA STREAM BY SELECTION AMONG A SET OF COMPRESSION TOOLS

BACKGROUND OF THE INVENTION

Transmission of data through a communication channel is expedited by compressing the data prior to transmission. Such compression reduces the number of bits required to transmit the data (thereby enhancing the speed of transmission), while the data is recovered or decompressed at the receiving end of the channel with the original number of bits. The efficacy of the compression process is the ratio of the number of bits of the raw data divided by the number of bits of the compressed data, sometimes referred to as the compression ratio.

In most applications, the data is of a single known fixed type, such as video images, scientific data, text, curves, etc. For example, in a communication channel transmitting video data, it is conventional to employ a compression process specifically designed for video images. It is also conventional to adapt or change the parameters of that compression process to optimize it as the image content of the data stream changes over time. Specifically, a compression process for video data can include run length encoding, discrete cosine transforming and quantization. In such a case, adapting the compression parameters can involve changing the quantization parameters for different video frames, depending upon their image content. Such adaptation can be carried out in other compression processes employed in compressing data other than video data.

Different types of information require different types of compression algorithms. For example, a compression algorithm that attains the maximum compression ratio of data representing scientific measurements will not perform as well on a different type of data (e.g., data representing an image). In fact, an ill-suited compression algorithm can be worse than no compression. Therefore, compression can only be attained and optimized using a compression algorithm dedicated to the type of information being compressed.

A typical characteristic of such compression processes is that, while they may be adaptable and responsive to changes in the data, they do not change in type. That is, for example, a video compression process remains a video compression process although it may be adaptive to changes in the image content. Thus, the data processed in such communication channels must be of a particular type (e.g., video data, text, curves, etc.), or else the change in data type must be pre-arranged or known a priori. For example, communication over the internet may involve the transmission of compressed data files containing a particular type of information. The data file itself indicates the decompression process required in opening ("unzipping") the file or displaying its contents (e.g., video or audio or text), and therefore this information can be discerned after reception at the receiving node in the communication channel. Moreover, in the case of the internet for example, the data compression and other features of the physical layer of the modem remain unchanged and are not adaptive nor responsive to changes in the data or information content in the communication channel. Therefore, in such a communication channel, speed and/or compression is not optimized.

A problem therefore arises in the case of a data channel in which speed is so critical that the compression process consistently must be effective over a wide range of different types of data whose optimum compression algorithms are entirely different are transmitted at different times that vary randomly or are not previously known or indicated. For example, one frame of the data stream may contain text, the next two may contain graphs or statistical data and a further set of frames may contain images, and this pattern may not repeat and may be unknown until the time the data is presented for immediate compression and transmission. Since the effective compression algorithms for the different data types in this example are entirely different, no single compression process or algorithm can suffice. The prior art is therefore inadequate to provide effective compression of each and every frame of such a data stream. This is because typical prior art compression schemes, even those described as being "adaptive", assume a single type of data being continuously transmitted and therefore require a single type of compression algorithm be used continuously.

This problem arises in real practical situations. For example, missile telemetry involves the high speed transmission of measurement data, statistical data, text and other different types of information. In order to fit more data and information into the telemetry channel, compression of the data must be improved, so that effective compression is achieved for each of the different types of data that are transmitted. The problem is that some of the low frequency information (e.g., scientific measurements) must be compressed using a lossless process, other higher frequency information (performance curves or graphs) can be compressed by curve fitting or statistical characterization and still other information such as images can be compressed using very lossy processes such as those referred to above. Providing effective or nearly optimum compression for the entire data stream is not possible using conventional approaches.

SUMMARY OF THE DISCLOSURE

A stream of raw data is compressed prior to transmission in a communication channel by a system which includes modules for choosing a current segment of the raw data stream for processing and defining a set of operators for representing data segments by a mathematical operation and parameters thereof. The system performs a competitive evaluation of different tools comprising different combinations of one or more of the operators and the parameters thereof with respect to the current data segment in order to determine relative abilities among the different tools to reduce the number of bits required to represent the current data segment. The system then selects a tool and a set of parameters thereof found in the competitive evaluation to have a superior ability relative to others of the different tools to reduce a number of bits required to represent the current data segment. This is done for each successive segment in the raw data stream, so as to form a compressed data stream including, for each one of the successive data segments, a reconstruction guide comprising a description of the operators and their parameters constituting the tool selected for the one data segment.

Furthermore after selecting a tool, the system determines a remaining data string constituting a difference between the current raw data segment and a data segment reconstructed using the selected tool including the operators and parameters thereof. The system then performs a bit cropping process on the remaining data string to produce a cropped remaining data string associated with the selected tool for the current data segment, and a cropping descriptor of the parameters employed in the bit cropping process for the remaining data string. The compressed data stream includes the cropped remaining data string and the cropping descriptor with the reconstruction guide.

The set of operators includes operators which represent amplitudes of successive samples of a data segment as a geometrical shape. The set of operators also includes operators which represent amplitudes of successive samples of a data segment as a mathematical function. The set of operators also includes an operator for removing irregularities in the current data segment.

BRIEF DESCRIPTION OF THE DRAWINGS

FIG. 3 is a graph of a set of successive samples of a segment of a raw data stream in accordance with one example.

FIG. 4 is a graph of a set of successive samples of a segment of a raw data stream in accordance with another example.

FIG. 5A is a graph of a set of successive samples of a segment of a raw data stream in accordance with a further example.

FIG. 5B is a graph representing a remaining data stream corresponding to the data segment of FIG. 5A.

DETAILED DESCRIPTION

Figure 1:
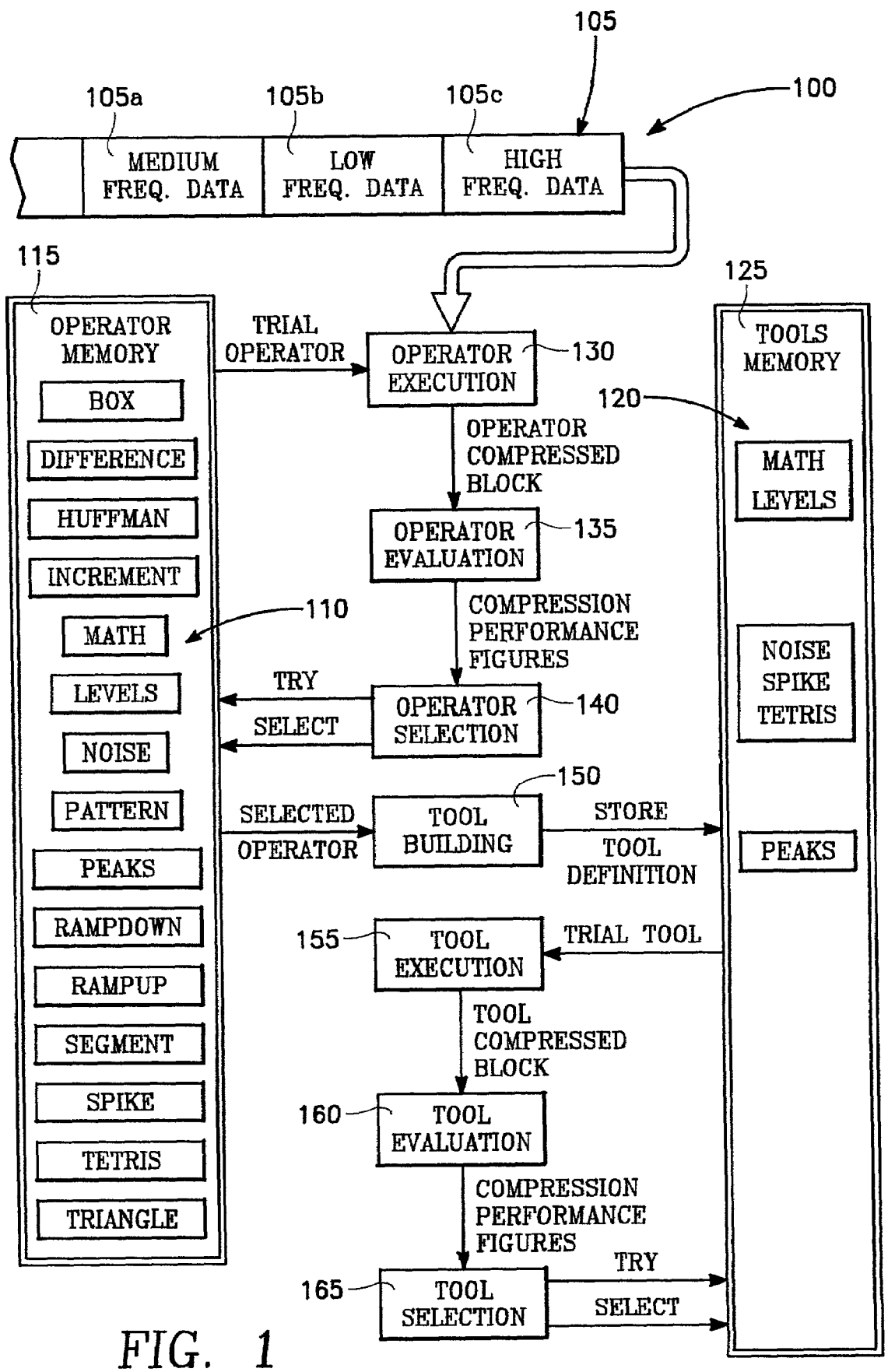
FIG. 1 is a schematic diagram of a system for competitive evaluation of compression operators and compression tool building in which a tool is selected to compress a current block of raw data.

Referring to FIG. 1, a serial stream of raw data 100 is to be compressed prior to transmission on a communication link. The data stream 100 consists of high and low frequency data of various kinds in various blocks 105a, 105b, 105c, etc., of the data stream 100. In order to compress a current block 105 of the data stream 100 prior to transmission, the data in the block 105 is cropped using conventional data cropping techniques including variable bit length encoding and zero packing or zero run length encoding. However, the results of such data cropping are greatly improved by first processing the data block using a selected tool built from a set of operators described below that is optimized for the current data block. The competitive evaluation and selection of the tool is now described.

A set of operators 110 capable of transforming the data in various ways is stored in a memory 115. The operators 110 form a nearly complete set of operators whose various permutations and combinations form different tools capable of representing different types of data in brief representations, as will be discussed later in this specification. Compression is achieved in this way because, for example, in some cases an entire data segment consisting of thousands of digital samples can be represented by a single operator and the values of its parameters at a cost of a relatively small number of bits of data.

For the current data block 105, the set of operators may be competitively evaluated. Or, a set of likely tools 120 consisting of selected combinations of the operators 110 are built and stored in a tool memory 125. The tools 120 may be constructed by user selection or by a competitive evaluation process or genetic algorithm which will now be described.

Genetic Tool Building Process

Each tool 120 in the tool memory 125 is a particular combination of the operators 110. The tools 120 are differentiated from one another either because they consist of different operators 110 or different combinations of plural operators, or the same combination but executed in a particular order or the same operator or operators but with different parameters (such as data segment length). As part of the competitive evaluation process, different segment lengths can be attempted in an effort to improve the tool. For example, a segment consisting of the entire current block of raw data can be selected if the entire current block consists of something, such as a simple shape, that is easily represented by a single tool or even a single operator. As an operator or tool is chosen, its parameters (including the segment length) are varied on a trial basis in order to attempt performance improvement, as part of the competitive evaluation process. Conversely, for a given segment length, different operators are tried, and this latter example will now be explored.

In the competitive evaluation process, a particular operator or tool or set of parameters is evaluated against other candidates on the basis of the number of bits the operator or tool and the corresponding parameters requires to represent the raw data. The smaller the number of bits with which the raw data segment can be represented, the higher the candidate operator or tool is evaluated. Ideally, the tool and/or parameters values resulting in the least number of bits to represent the current data segment is ultimately selected over all other candidates.

If a given segment length is selected for trial evaluation, the process can proceed as follows. First, for a current segment of the data block to be compressed, a sub-set of the operators 110 constituting the likeliest candidates for inclusion in various tools is identified by competitive evaluation by an operator execution module 130 and an operator evaluation module 135. For each candidate operator 105, the operator execution module 130 carries out the candidate operator functions on the current data segment and furnishes the results to the evaluation module 135. The evaluation module 135 determines the number of bits required to represent the current data segment. The current data segment is a succession of digital samples from the raw data stream, the length of the current data segment having been chosen beforehand on a trial basis. An operator selection module 140 compares this number with that obtained with other operators previously evaluated and ranks the operators accordingly. After a sufficient number (or all) of the operators have been evaluated, the selection module 140 marks a group of the highest ranking operators for possible inclusion in various tools to be constructed.

A set of candidate tools 120 is formed by defining various combinations of the operators marked by the selection module 140 and storing them in the tool memory 125. This task may be carried out by the user or by a tool building module 150. For each candidate tool 120, an tool execution module 155 carries out the candidate tool functions on the current data segment and furnishes the results to a tool evaluation module 160. The evaluation module 160 determines the number of bits required to represent a current group of data segments using the particular tool 120. A tool selection module 165 compares this number with that obtained with other tools previously evaluated and ranks the tools 120 accordingly. After a sufficient number (or all) of the tools 120 have been evaluated, the tool selection module 165 selects the highest ranking tool 120 from the memory 125 to use in compressing the current data segment.

Thereafter, the above is repeated for the next data segment of the raw data stream. Or, in some instances, the parameter specifying the length of the current data segment may be changed (to change the definition of the current data segment) and the entire procedure is carried out again on the new version of the current data segment. In this way, the system can constantly determine on a trial basis the best definition of data segment length, so that this definition can dynamically change as the data characteristics change along the raw data stream.

Operators and Tools

Figure 2:
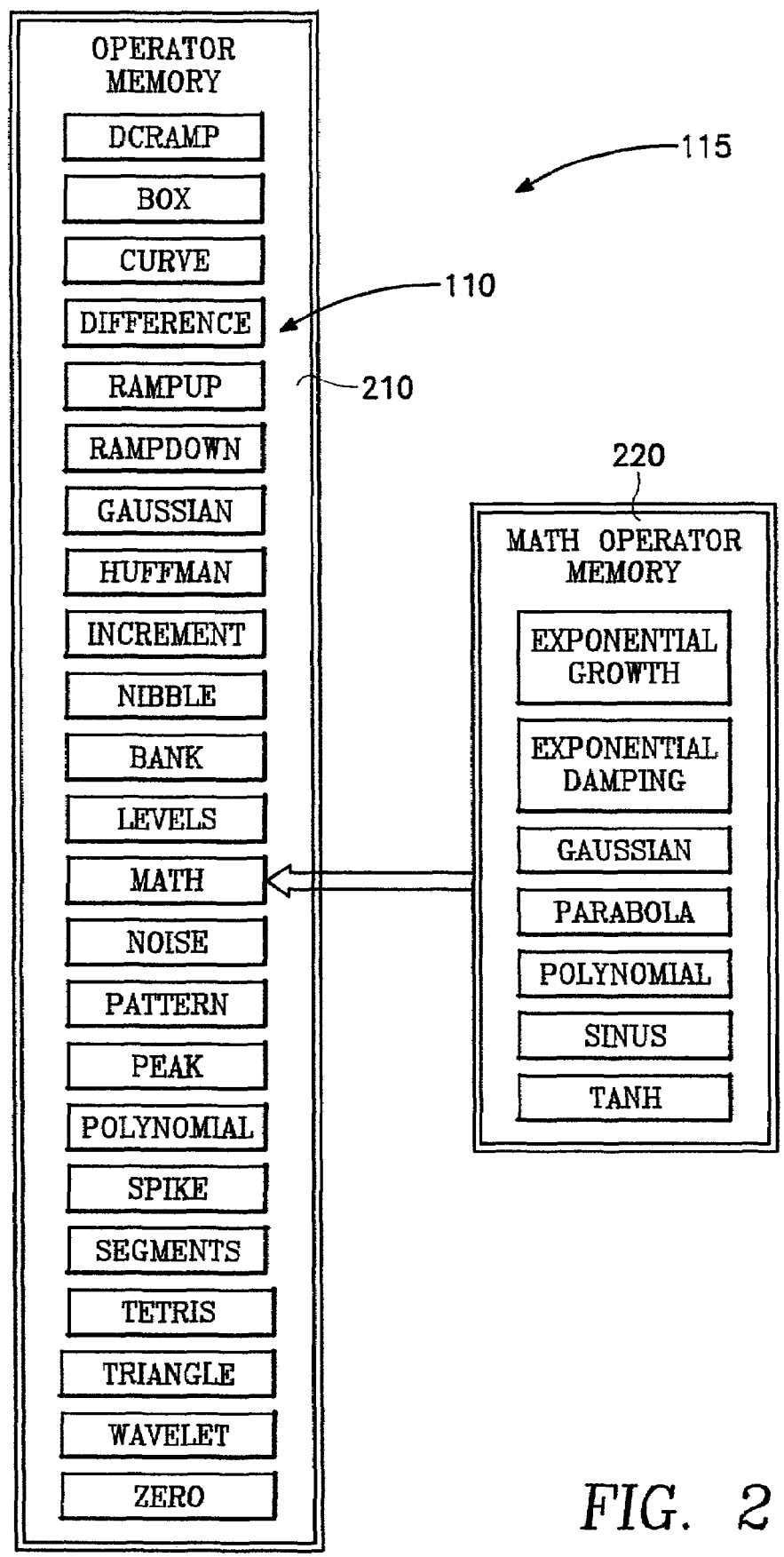
FIG. 2 is a schematic diagram of a memory in the system of FIG. 1 storing a set of selectable compression operators and for storing a set of compression tools built from combinations of the operators.

FIG. 2 illustrates an architecture of the memory 115 for storing the various operators 110. The basic operators 110 are stored in a first portion 210 of the memory 115. Each operator operates on a sequence of f successive digital samples in the current data block, where f is an integer and is the number of digital samples in the sequence. For each operator, the number f is a parameter which can be varied during the competitive selection process to improve performance, as mentioned hereinabove. Other parameters of the various operators will be discussed below as well. The operators 110 stored in the memory portion 210 form a fairly complete set for representing a broad range of different types of data with different frequency content. These operators are now described and constitute conventional mathematical operations that are readily implemented the skilled worker from these descriptions:

The DCRAMP operator defines a ramp function starting at the beginning of the specified sequence and terminating at the end of the sequence, two parameters of this operator being the slope and intercept of the ramp function.

The BOX operator shifts the amplitude by a specified amount over the entire sequence.

The CURVE operator fits a curve to the data segment. A necessary parameter of this operator is a set of criteria defining the curve shape.

The DIFFERENCE operator replaces the amplitude values of the segment with amplitude differences between pairs of successive samples.

The RAMPUP operator, defines a ramp (like the DCRAMP operator), having a positive slope.

The RAMPDOWN operator defines a ramp having a negative slope.

The GAUSSIAN operator fits a gaussian function to the specified data segment. The necessary parameters of this operator are the well-known mathematical parameters of the Gaussian function.

The HUFFMAN operator reduces the data segment using conventional Huffman encoding.

The INCREMENT operator represents the current sample by adding a specified incremental amount to the amplitude of the previous sample in the data segment.

The NIBBLE operator uses either subtraction or division to smooth out (remove) spikes in the data segment.

The BANK operator reduces the data segment by bankwise subtraction of the data segment.

The LEVELS operator operates in the same manner as the increment operator, but is shifted to zero amplitude.

The MATH operator invokes any one of a set of MATH operators stored in a second portion 220 of the memory 115. The math operators in the second memory portion 220 include:

EXP GROWTH, an operator which represents the data segment as an exponentially increasing function;

EXP DAMPING, an operator which represents the data segment as an exponentially decaying function;

GAUSSIAN, which is the same as the GAUSSIAN operator listed above;

PARABOLA, an operator which represents the data segment as a parabolic function;

POLYNOMIAL, an operator which represents the data segment as a polynomial whose parameters are the coefficients of each power of the independent variable;

SINUS, an operator which represents the data as a sine function whose parameters are the frequency, phase and amplitude of the sine function;

TANH, an operator which represents the data as hyperbolic tangent function.

Continuing the description of the operators stored in the first memory portion 210, the NOISE operator shifts the amplitude of the entire data segment downwardly so that the noise level is at zero amplitude.

The PATTERN operator represents the current data segment as one of a repetitive pattern from previous data segments.

The PEAK operator identifies and compensates for peak amplitudes;

The POLYNOMIAL operator is identical to the POLYNOMIAL operator referred to above with reference to the second memory portion 220.

The SPIKE operator identifies and removes spikes in the data segment.

The SEGMENTS operator represents the current data segment as a succession of average amplitude values of a cession sub-segments into which the current data segment is divided.

The TETRIS operator is similar to the BOX operator discussed above, but can begin at any point within the current data segment.

The TRIANGLE operator is a combination of the RAMPUP and RAMPDOWN operators.

The WAVELET operator represents the current data segment as a wavelet shape.

The ZERO operator packs a succession of zeroes in the conventional manner.

In order to illustrate a simple instance of how such operators can be employed, consider the raw data segment of FIG. 3 in which the successive data samples of the current segment decrease in linear fashion. Competitive selection among the foregoing operators will result in the selection of the RAMPDOWN operator to represent the current data segment of FIG. 3, at least for the portion of the data segment lying between time zero and time A. As for the portion lying between time A and time B, all of the amplitudes are zero, and therefore competitive selection will result in this latter portion being represented by the ZERO operator. Since the competitive evaluation process will try various segment lengths for the various operators, it will discover that the best segment for the RAMPDOWN operator is the sub-segment from time 0 to time A, while the best segment for the ZERO operator is the sub-segment from time A to time B in FIG. 3.

As another example, the current data segment may correspond to the Gaussian-like curve of FIG. 4, that includes a high narrow spike and a tail extending from time A to time B of mainly zero amplitude samples. The competitive selection process would find that, in trying different data segment lengths as part of its effort in trying different parameter values, a better performance is achieved by changing the data segment length into two segments, namely a segment from time 0 to time A and a segment from time A to time B. The best operator for the second segment (from A to B) would be the ZERO operator. For the first segment (from 0 to A), the competitive evaluation process would find that elimination of the spike by the SPIKE operator would permit the remaining smoothed curve to be represented either by the GAUSSIAN operator or by the CURVE operator (invoking conventional curve fitting techniques).

The example of FIGS. 5A and 5B illustrates the concept of a remaining data segment or remaining string. If the current raw data segment corresponds to the sloping line of FIG. 5A that has a slight dimple, the data segment can be almost perfectly represented by the RAMPDOWN operator, resulting in a small difference between the raw data segment and an Auncompressed@ version thereof reconstructed using ramp function of the RAMPDOWN operator, this small difference being illustrated in FIG. 5B. Therefore, unless a further operator is invoked by the competitive selection process, there is a remaining segment that is the residue of the compression by the rampdown operator, and this residue or remaining segment corresponds to the curve of FIG. 5B. As will be described below, the remaining data string is cropped and then transmitted in the compressed data stream along with the tool and parameter descriptions.

In many instances, very simple operators can be used with great effect to reduce the data. For example, where a continuum of data samples of zero amplitude occurs, the ZERO operator can be exploited to pack the zero samples using conventional techniques. Such an operator may be the only operator employed a majority of the time, depending upon the characteristics of the data. This operator is employed in a data cropping module to be described below.

As mentioned hereinabove, each operator has certain parameters that must be specified before the operator can be executed. For example, the number f of successive samples constituting the data sequence on which the operator is to operate is one such parameter. Another example of a parameter is the amplitude representing a geometric point of an operator, such as the starting and ending amplitudes of the DCRAMP operator (for example). The data sequence encompassed by such an operator is replaced in the compressed data stream by the name of the operator followed by the names and values of the various parameters associated with that operator.

Thus, for each tool consisting of multiple operators used in compressing the raw data, the raw data must be replaced in a compressed data stream by a record consisting of the names of the operators comprising the tool and the parameters required to execute those operators on the segment of raw data. The operator names and the associated parameter values constitute a so-called reconstruction "blue-print" for reconstructing an approximation of the data samples represented by the tool or operator. In addition, the record must include a remaining data string constituting a residual difference between the reconstructed approximation of the data samples and the raw data samples. Compression is achieved as long as the number of bits required to represent the reconstruction blue-print and the remaining data string is less than the number of bits constituting the corresponding raw data samples.

Figure 6:
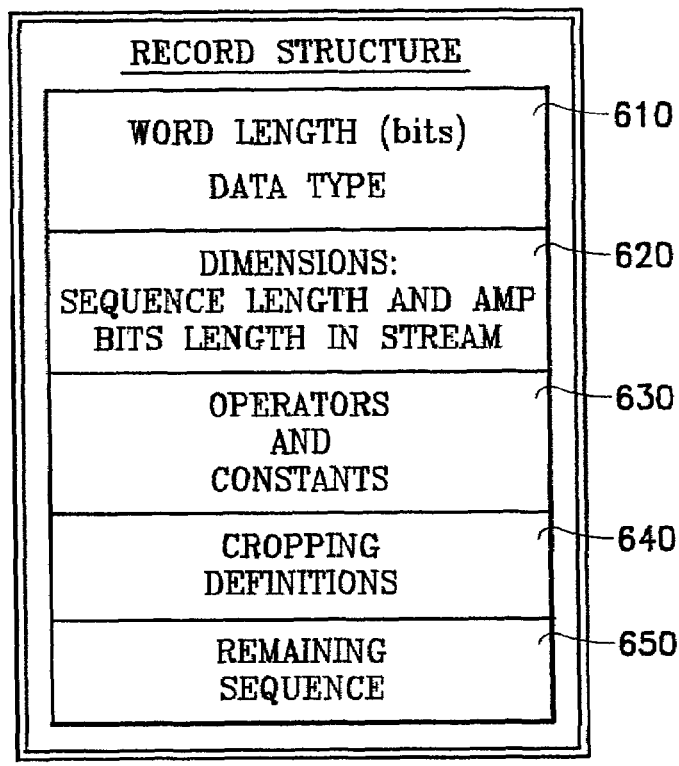
FIG. 6 is a diagram of a compressed data record in accordance with the invention.

The structure of one such record is illustrated in FIG. 6, and includes a frame 610 containing data specifying the word or bit length of the record and the type of data. Another frame 620 contains data specifying the dimensions of the raw data sequence that has been compressed, such as the bit length of the sequence and the amplitude range. A further frame 630 contains the description of the operators and their parameters that comprise the tool used to compress the data sequence. A next frame 640 contains the definitions of the cropping operations used to crop the remaining bit sequence. A last frame 650 contains the remaining bit sequence of the data. How this remaining bit sequence of the last frame is formed will be described below with reference to FIG. 7.

Figure 7:
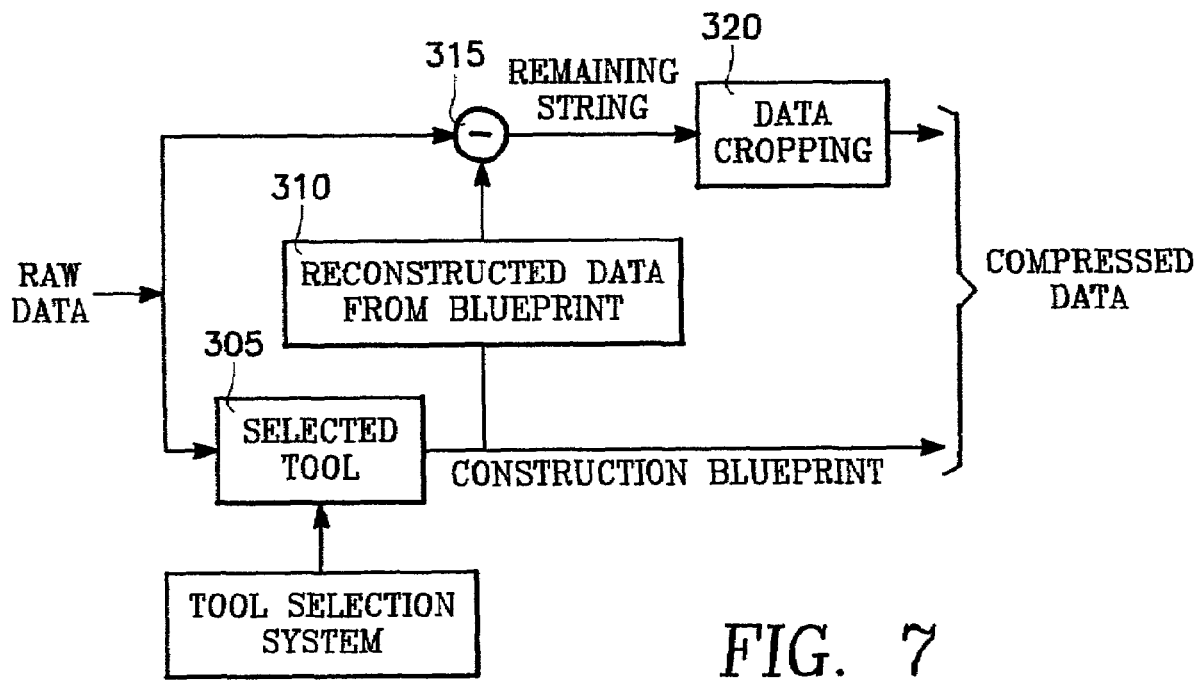
FIG. 7 is a schematic diagram of a system for compressing a block of raw data using the tool selected by the system of FIG. 1.

A compression system for carrying out the foregoing operation is illustrated in FIG. 7. A selected tool 305 is received from the tool building system of FIG. 1, and consists of one or more of the operators in the operator memory 115 of FIG. 2 along with a description of their parameter values. The current segment of raw data is converted by the selected tool 305 to a reconstruction blue-print. A reconstruction module 310 produces a reconstructed approximation of the data segment. A subtractor 315 forms the residual difference between the reconstructed approximation and the raw data segment itself, this residual difference being the remaining data string that must accompany the reconstruction blue print. A data cropping module 320 performs data cropping on the remaining data string and the result is the compressed data string. The parameters of the data cropping are transmitted along with the remaining compressed data string (as part of the record of FIG. 6). The data cropping parameters are used after the compressed data is received and serve as a necessary guide for de-cropping of the remaining data string (using conventional techniques).

Figure 8:
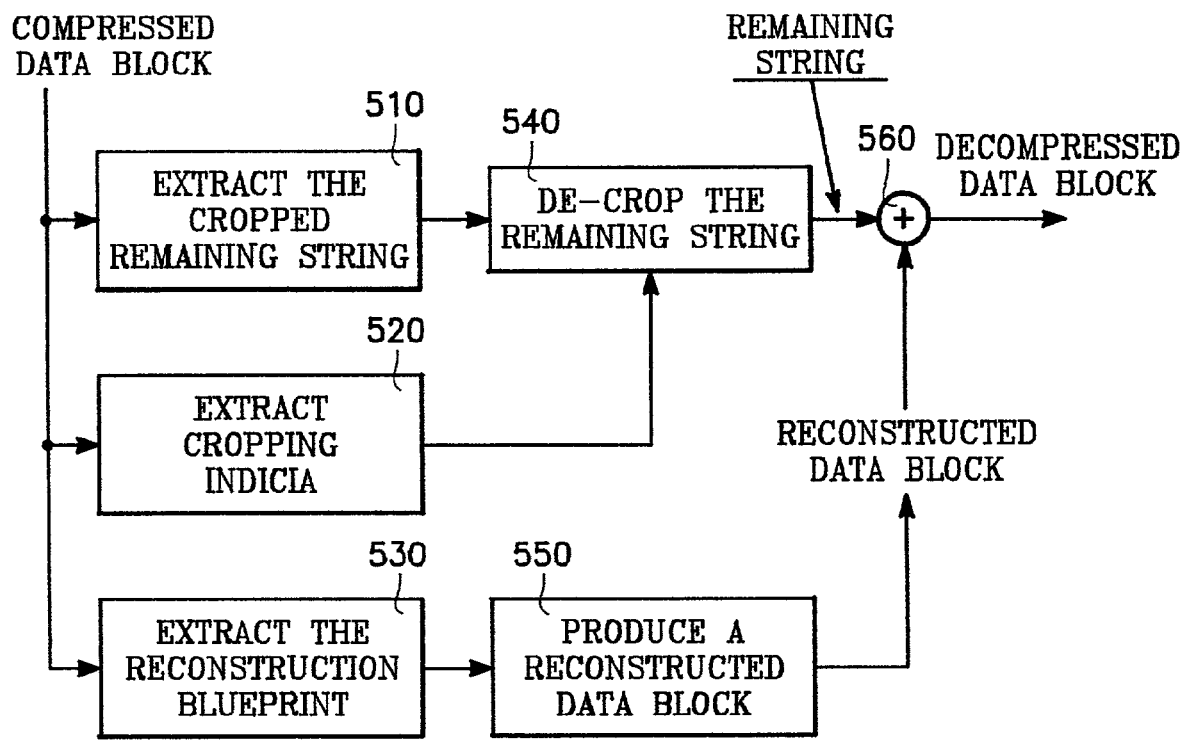
FIG. 8 is a schematic diagram of a system for decompressing the data compressed by the system of FIG. 3.

A system for decompressing the data compressed by the system of FIG. 7 is illustrated in FIG. 8. A current segment of the compressed data is processed by a string extract module 510, a cropping extract module 520 and a reconstruction blueprint extract module 530. The string extract module 510 extracts the compressed or cropped remaining data string from the compressed data segment. The cropping extract module 520 extracts the cropping parameters employed by the cropping module 330 of FIG. 3 in cropping the remaining data string of the current data segment. The reconstruction blueprint extract module extracts the reconstruction blueprint from the current segment of compressed data. A de-cropping module 540 restores the compressed remaining data string to its previous uncropped (uncompressed) form using the parameters extracted by the module 520. These parameters include, for example, the number of bits per sample and/or the number of zero amplitude samples in a run of zeroes, for example. A reconstruction processor 550 reconstructs an approximation of the current data segment using the reconstruction blueprint extracted by the module 530. (Again, the reconstruction blueprint is the description of the tool/operators and the parameter values thereof.) The reconstructed approximation of the current data segment is provided with a slight correction in an adder 560 by adding to it the remaining data string reconstructed by the de-cropping module 540. The result is a reconstructed or decompressed version of the original raw data segment.

Figure 9:
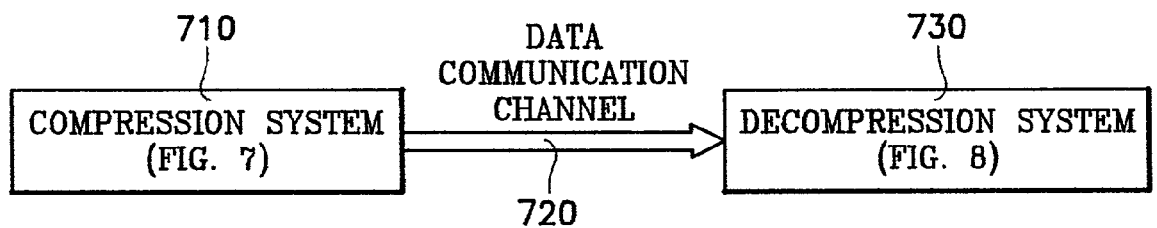
FIG. 9 is a block diagram illustrating a communication system including the compression system of FIG. 7 and the decompression system of FIG. 8.

FIG. 9 illustrates a complete communication system including a compression system 710 corresponding to the compression system of FIG. 7, a digital communication channel 720 and a decompression system 730 corresponding to the decompression system of FIG. 8.

In conclusion, the invention provides a versatile compression/decompression system for data communication that is applicable over a wide range of different data types. While many of the examples discussed above are related to large data ensembles that can be represented by curves or simple functions characteristic of scientific measurement data or instrumentation, the invention is also applicable to other types of data. For example, even image data and video data can be handled and likely would result in the competitive evaluation process choosing the DIFFERENCE operator, among others.

It is understood that the foregoing invention can be carried out by programming a computer to perform many of the functions described herein. In doing so, the skilled worker will employ efficient architectures. For example, the names of the tools can be dynamically allocated so that the field length of each name varies with the number of tools to be named, in order to save processing time. Furthermore, storage of the tools in memory may use relative positioning, so that unused tools do not translate into unused memory spaces, and the memory spaces used for the tools are contiguous, in order to save processing time.

While the invention has been described in detail by specific reference to preferred embodiments, it is understood that variations and modifications thereof may be made without departing from the true spirit and scope of the invention.

What is claimed is:

1. A method of preparing a stream of raw data for transmission in a communication channel, comprising:
   choosing a current segment of the raw data stream for processing;
   defining a set of operators for representing data segments by a mathematical operation and parameters thereof;
   performing a competitive evaluation of candidate tools, said candidate tools comprising variable combinations of one or more of said operators and the parameters thereof, on said current data segment in order to determine relative abilities among the candidate tools to compress the current data segment;
   selecting a best candidate tool and a set of parameters thereof found in said competitive evaluation having a superior ability relative to other candidate tools to compress the current data segment;
   compressing the current data segment using the best candidate tool to obtain a compressed data segment;
   carrying out the choosing, defining, performing, selecting and compressing steps for subsequent data segments of said data stream; and
   forming a compressed data stream representing said raw data stream, said compressed data stream comprising the compressed data segments, for each one of the successive data segments, and a reconstruction guide comprising a description the best candidate tools and their parameters for each data segment.

2. The method of claim 1 further comprising:
   after the step of selecting a best candidate tool, determining a remaining data string constituting a difference between the current raw data segment and a data segment reconstructed using the selected best candidate tool including the operators and parameters thereof;
   performing a bit cropping process on said remaining data string to produce a cropped remaining data string associated with the selected best candidate tool for the current data segment, and a cropping descriptor of the parameters employed in the bit cropping process for said remaining data string;
   and wherein the step of forming a compressed data stream comprises including said cropped remaining data string and said cropping descriptor with said reconstruction guide.

3. The method of claim 2 wherein said cropping comprises at least one of:
   variable length bit encoding;
   zero run length encoding.

4. The method of claim 1 wherein said set of operators comprises operators which function individually to represent amplitudes of successive samples of a data segment as a geometrical shape.

5. The method of claim 1 wherein said set of operators comprises operators which function individually to represent amplitudes of successive samples of a data segment as a mathematical function.

6. The method of claim 4 wherein said set of operators comprises an operator capable of transforming the current data segment into a form conducive of representation by another operator that represents a data segment as a geometrical shape.

7. The method of claim 5 wherein said set of operators comprises an operator capable of transforming the current data segment into a form conducive of representation by another operator that represents a data segment as a mathematical function.

8. The method of claim 6 wherein the operator capable of transforming the data segment comprises an operator for removing a spike.

9. The method of claim 7 wherein the operator capable of transforming the data segment comprises an operator for removing a spike.

10. The method of claim 1 wherein the step of performing a competitive evaluation comprises evaluating the bit length of the representation of the current data segment by an operator with different trial parameter values of the operator.

11. The method of claim 1 wherein the step of performing a competitive evaluation comprises evaluating the bit length of the representation of the current data segment by different operators.

12. The method of claim 1 wherein the step of performing a competitive evaluation comprises evaluating the bit length of the representation by an operator of sub-segments of different lengths of the current data segment.

13. The method of claim 4 wherein said set of operators for representing data segments with geometrical shapes comprise at least plural ones of the following set of operators:
   a ramp operator;
   a box operator;
   a curve operator; and
   a triangle operator.

14. The method of claim 5 wherein said set of operators for representing data segments with mathematical functions comprise at least plural ones of the following set of operators:
   a gaussian operator;
   a difference operator;
   a polynomial operator;
   a segments operator;
   an exponential operator;
   a parabola operator; and
   a trigonometric function operator.

15. A data communication system comprising:
a data compressor for compressing a raw data stream divisible into successive data segments, said data compressor comprising:
a memory storing a set of operators for representing data segments by a mathematical operation and parameters thereof;
a competitive evaluation module for performing a competitive evaluation of candidate tools comprising variable combinations of one or more of said operators and the parameters thereof with on variable data segments of said raw data stream in order to determine relative abilities among the candidate tools to compress the variable data segments;
a selection module for selecting a best candidate tool and a set of parameters thereof and a preferred data segment found in said competitive evaluation to have a superior ability relative to others of the candidate tools to compress the preferred data segment; and
means for compressing the preferred data segment and successive preferred data segments forming a compressed data stream representing said raw data stream and a reconstruction guide comprising a description of the operators and their parameters constituting the best candidate tool selected for each preferred data segment.

16. The system of claim 15 further comprising:
a subtractor for forming a remaining data string as a difference between the current raw data segment and a data segment reconstructed using the selected best candidate tool including the operators and parameters thereof;
a bit cropping module for performing a bit cropping process on said remaining data string to produce a cropped remaining data string associated with the selected best candidate tool for the current data segment, and a cropping descriptor of the parameters employed in the bit cropping process for said remaining data string;
wherein the means for forming a compressed data stream inserts into said compressed data stream said cropped remaining data string and said cropping descriptor with said reconstruction guide.

17. The system of claim 16 further comprising:
a decompressor and a data communication channel connected between said decompressor and said compressor, said compressor comprising:
a reconstruction module for reconstructing a data segment from a description of a tool and its parameter values;
a decropping module for reconstructing a remaining data string from a compressed data string and a set of cropping parameters corresponding thereto; and
an adder for adding a reconstructed data string to a reconstructed data segment corresponding thereto.

18. The system of claim 15 wherein said set of operators comprises an operator that represents a data segment as a geometrical shape.

19. The system of claim 15 wherein said set of operators comprises an operator that represents a data segment as a mathematical function.

20. The system of claim 15 wherein said set of operators comprise:
respective operators that represent data segments as respective geometrical shapes;
respective operators that represent data segments as respective mathematical functions; and
an operator for removing spike irregularities from a data segment.

* * * * *